United States Patent
Clements et al.

(10) Patent No.: US 10,181,591 B2
(45) Date of Patent: Jan. 15, 2019

(54) PEN BATTERY MECHANICAL SHOCK REDUCTION DESIGN

(71) Applicant: Microsoft Technology Licensing, LLC, Redmond, WA (US)

(72) Inventors: Bradley E. Clements, Fort Collins, CO (US); Gabriel J. Pirie, Seattle, WA (US); Perry H. Pierce, Fort Collins, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/244,001

(22) Filed: Aug. 23, 2016

(65) Prior Publication Data

US 2018/0063984 A1 Mar. 1, 2018

(51) Int. Cl.
| | |
|---|---|
| *H05K 7/10* | (2006.01) |
| *H01M 2/10* | (2006.01) |
| *H05K 3/30* | (2006.01) |
| *H05K 1/18* | (2006.01) |
| *H01M 10/42* | (2006.01) |

(52) U.S. Cl.
CPC ....... *H01M 2/1055* (2013.01); *H01M 10/425* (2013.01); *H05K 1/181* (2013.01); *H05K 3/303* (2013.01); *H01M 2220/30* (2013.01); *H05K 2201/10227* (2013.01)

(58) Field of Classification Search
CPC .... H05K 7/1038; H05K 7/1069; H05K 1/181; H05K 3/303; H05K 2201/10265; H01M 2220/30; H01M 2/10
See application file for complete search history.

(56) References Cited

U.S. PATENT DOCUMENTS

| | | | |
|---|---|---|---|
| 5,250,371 A | * | 10/1993 | Kleinert, III ......... H01M 2/105 429/99 |
| 6,213,661 B1 | | 4/2001 | Coon |
| 7,180,509 B2 | | 2/2007 | Fermgard et al. |
| 8,308,387 B2 | | 11/2012 | King et al. |
| 8,698,784 B2 | | 4/2014 | Lin |

(Continued)

FOREIGN PATENT DOCUMENTS

| | | |
|---|---|---|
| CN | 2619794 | 6/2004 |
| CN | 203004680 | 6/2013 |

(Continued)

OTHER PUBLICATIONS

Joy "PinpointTM X-Spring Precision Stylus & Pen", 3 P., Feb. 26, 2015.

*Primary Examiner* — Hoa C Nguyen

(57) ABSTRACT

A device and a method for manufacturing of a printed circuit board for installing in a battery-powered device, the method including mounting on a printed circuit board (PCB) a PCB surface mount component comprising a planar mount configured to be mounted on the PCB and a kinetic energy absorption element with a battery contact on a distal end of the energy absorption element, and trimming the PCB out of a panel comprising the PCB and a border around the PCB, the border connected integrally with the PCB, wherein the border comprises supports configured to support corresponding ear extensions in the absorption element in order to align the battery contact with a PCB plane.

20 Claims, 4 Drawing Sheets

(56) References Cited

U.S. PATENT DOCUMENTS

| | | |
|---|---|---|
| 9,001,082 B1 | 4/2015 | Rosenberg et al. |
| 2002/0120655 A1 | 8/2002 | Liu et al. |
| 2013/0121645 A1* | 5/2013 | Haley .................. G02B 6/3821 |
| | | 385/77 |

FOREIGN PATENT DOCUMENTS

| CN | 20365125 | 6/2014 |
|---|---|---|
| CN | 104875524 | 9/2015 |

* cited by examiner

PEN BATTERY MECHANICAL SHOCK REDUCTION DESIGN

FIELD AND BACKGROUND OF THE INVENTION

Hand-held battery-powered devices such as, for example, electronic pens, flash lights, remote controllers, and the like, usually include fragile internal electronic components on a printed circuit board (PCB) that may be easily damaged by collisions with the battery, for example when the device is shaken or dropped.

The internal component arrangement of such devices is usually manufactured by a pick-and-place process, in which components are delivered to production line machines, which pick the components and mount them on PCBs layered on conveyor belts.

In order to avoid destruction of the internal components, some devices utilize coiled springs as battery contacts, which require a separate installation process after the manufacturing of the printed circuit board and the surface mounting process. Such separate installation process makes the production expensive and time consuming, and thus less economically efficient.

Other devices include more robust plastic components that absorb the collisions. However, inclusion of such plastic components increases the size of the device and requires cumbersome designs.

SUMMARY OF THE INVENTION

According to some embodiments of the present disclosure, there is provided a battery support that provides shock absorption to internal fragile components of a device. The battery support according to some embodiments of the present disclosure is suitable for a production of a surface supporting and electrically connecting electronic components, such as a PCB automated surface-mount production.

Unless otherwise defined, all technical and/or scientific terms used herein have the same meaning as commonly understood by one of ordinary skill in the art. Although methods and materials similar or equivalent to those described herein can be used in the practice or testing of embodiments of the disclosure, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some implementations of the disclosure are herein described, by way of example only, with reference to the accompanying drawings. With reference now to the drawings in detail, it is stressed that the particulars shown are by way of example and for purposes of illustrative discussion of implementations of the disclosure. In this regard, the description taken with the drawings makes apparent to those skilled in the art how implementations of the disclosure may be practiced.

In the drawings.

DESCRIPTION OF SPECIFIC EMBODIMENTS OF THE INVENTION

Figure 1:
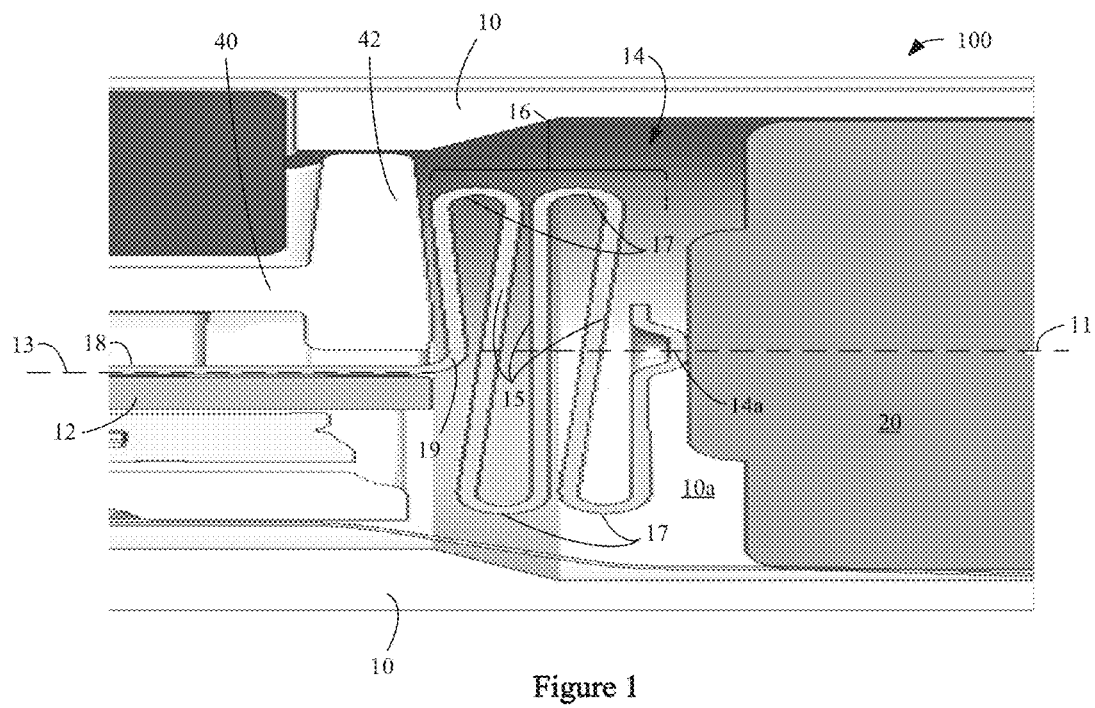
FIG. 1 is a schematic illustration of a cross-sectional view of a portion of an exemplary battery-powered device.

Some implementations of the present disclosure provide shock-absorbing battery contacts for installation in battery-powered devices.

The shock absorbing battery contacts provided by implementations of the present disclosure are suitable for surface mounting on a surface for supporting and electrically connecting electronic components, such as a PCB, in a routine surface mounting process, thus making any separate production process unnecessary. Therefore, some implementations of the present disclosure make the production cheaper and quicker, and enable efficient mass production without compromising the size and design of the device.

According to some implementations of the present disclosure, the shock absorbing battery contact elements have surface-mount picking surfaces which enable picking and placing of the contact elements on PCBs in a surface mount process.

According to some implementations of the present disclosure, a shock absorbing battery contact element includes a spring element having a wavy shape. The spring element absorbs the collision energy by contraction, optionally until tips of the wave meet, and then by further bending of intermediate sections. Optionally, shock load posts are mounted to absorb some of the collision energy before the spring element reaches excessive stress. This allows protecting the spring from damage.

According to some implementations of the present disclosure, another shock absorbing battery contact element includes a fan-shaped plate behind a battery contact, which distorts the collision energy away from the PCB plane and away from the center of the battery terminal into a housing of an insulating material. The plate may be fan-shaped, oval-shaped or cone-shaped, or may have any other suitable shape, allowing sufficient contact area with a support of the battery contact, in order to dissipate energy into the housing without deforming the surface of the housing.

In the manufacturing process, a PCB manufacturing panel may include support extensions to keep the shock absorbing contacts aligned with the PCB. After the PCB production, the PCB may be trimmed out of the panel and installed in a device.

Before explaining at least one embodiment of the exemplary implementations in detail, it is to be understood that the disclosure is not necessarily limited in its application to the details of construction and the arrangement of the components and/or methods set forth in the following description and/or illustrated in the drawings and/or the Examples. The disclosure is capable of other implementations or of being practiced or carried out in various ways.

According to some implementations of the present disclosure, there is provided a battery support that provides shock absorption to internal fragile components of a device. The battery support is suitable for a production of a surface supporting and electrically connecting electronic components, such as a PCB automated surface-mount production.

Referring now to the drawings, FIG. 1 illustrates a cross-sectional view of a portion of an example battery-powered device 100. Device 100 may be an electronic pen, a flashlight, a hand-held toy or any suitable battery-powered device, optionally hand-held or wearable. Device 100 may include a housing 10 sized and shaped to contain the exemplary battery-powered device 100 and one or more surfaces supporting and electrically connecting electronic components which are mechanically connected thereto. For example, housing 10 may be a tubular-shaped housing and/or may have an internal cavity designed to fit a suitable battery 20 insertable therein. The one or more surfaces may be a PCB 12 holding electronic components of device 100. PCB 12 may be positioned within housing 10 so that the surface plane of PCB 12 is substantially parallel to the longitudinal axis 11 of housing 10. PCB 12 and/or its components may be fragile and sensitive to bumps that may be caused by other internal components of device 100, for example when shaking or dropping device 100.

Housing 10 may include a battery compartment 10a for housing one or more batteries, for instance battery 20. Device 100 may include an elastic battery contact 14 that may conduct electric power to PCB 12 from battery 20, when a terminal of battery 20 contacts battery contact 14. The elasticity of battery contact 14 may enable absorption of bumps that may be caused by movements of battery 20 inside housing 10.

Elastic contact 14 may be made of a conductive material designed to have a spring effect, i.e., to absorb kinetic energy. For example, elastic contact 14 may be made of and/or include a flexible material such as, for example, a metal strip. In some implementations, elastic contact 14 is made of a stainless steel, which may include a Full Hard Stainless Steel SS301-FH. The yield stress of the flexible material may, for example, be about 1030 megapascal. For example, elastic contact 14 may have an energy absorption section such as elastic spring section 16, including a plurality of folds 17, for example two or four folds 17 as shown in FIG. 1 or any larger number of folds, for instance 6, 8, 10 or any intermediate number of folds. The folds 17 are connected by elastic straight sections 15, which are substantially straight at rest.

However, straight sections 15 have elasticity that allows them to bend when subject to stress. Elastic contact 14 is bent at an end of spring section 16, at bend 19, to form a planar surface mount 18 substantially normal to straight sections 15 at rest, for mounting onto a surface of PCB 12, as described in more detail herein. Therefore, when connected to PCB 12, spring section 16 is bent at bend 19 away from a plane 13 of planar surface mount 18, for example substantially normally to PCB 12 and/or to surface mount 18. At a distal end of spring section 16, elastic contact 14 includes a contact protrusion 14a, for contact with battery 20.

When battery 20 is inserted into device 100, elastic contact 14 may be pressed towards PCB 12, thus applying force on battery 20 in the opposite direction. In case of a movement of battery 20, for example because of shaking or dropping of device 100, spring section 16 absorbs the kinetic energy by compressing. In some implementations, spring section 16 is designed so that in a maximum compression state of spring section 16, adjacent folds 17 are in contact with each other while straight sections 15 keep distance from each other. At a higher stress, straight sections 15 may provide additional energy absorption by bending. In some implementations, during contraction of spring section 16, a fold 17 turns two sections 15 toward each other or turns one section 15 towards another section 15.

Figure 5:
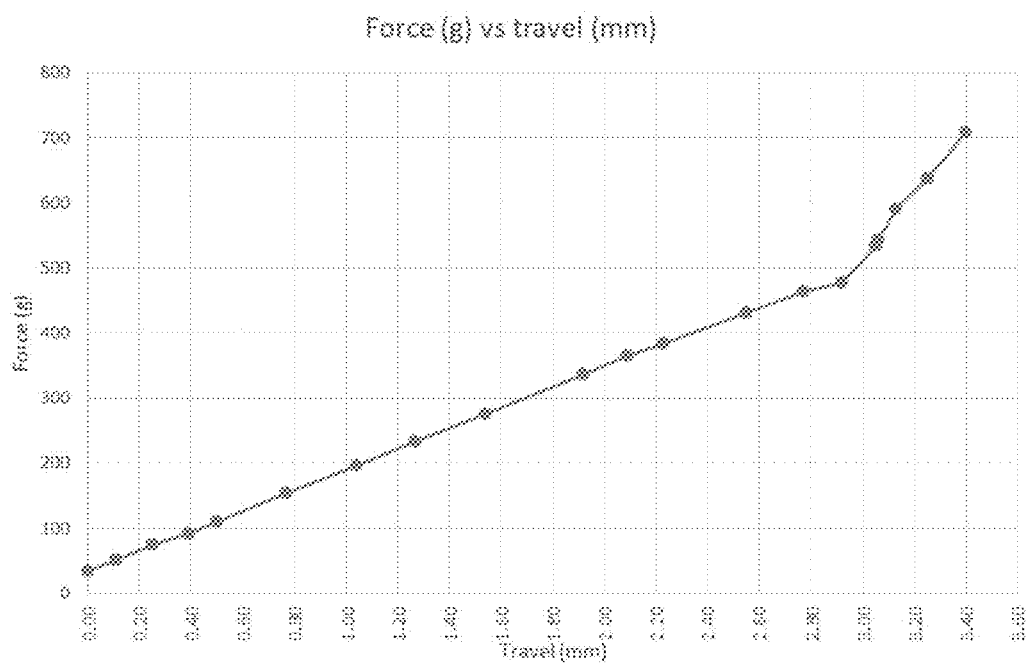
FIG. 5 is a spring rate graph of an exemplary spring section.

Reference is now made to FIG. 5, which is a spring rate graph of an example spring section 16, showing the force applied by spring section 16 in grams versus the contraction of spring section 16 in millimeters relative to its rest state. As shown in FIG. 5, the spring rate of the spring section 16 may be about 100-200 gram/millimeter (g/mm), as long as the contraction of the spring section 16 is smaller than about 2.8-3 millimeter (mm). For example, at a contraction of about 2.8-3 mm, folds 17 meet, which makes it much harder to further compress the exemplary spring section 16 and the spring rate becomes about 500-600 g/mm; wherein, for example, the straight sections 15 provides additional energy absorption by bending.

Returning to FIG. 1, device 100 may further include, within housing 10, one or more support elements 40. Support elements 40 may facilitate holding of components in place, reduce movement of components within housing 10 and/or block specific unwanted movements. For example, a wall 42 included in support element 40 may limit the bending of spring section 16 and/or prevent spring section 16 from excessive folding towards PCB 12, which may, for example, cause permanent deformation and/or damage to spring section 16. Support element(s) 40 may be made, for example, from plastic or from any other suitable insulating material.

Figure 2:
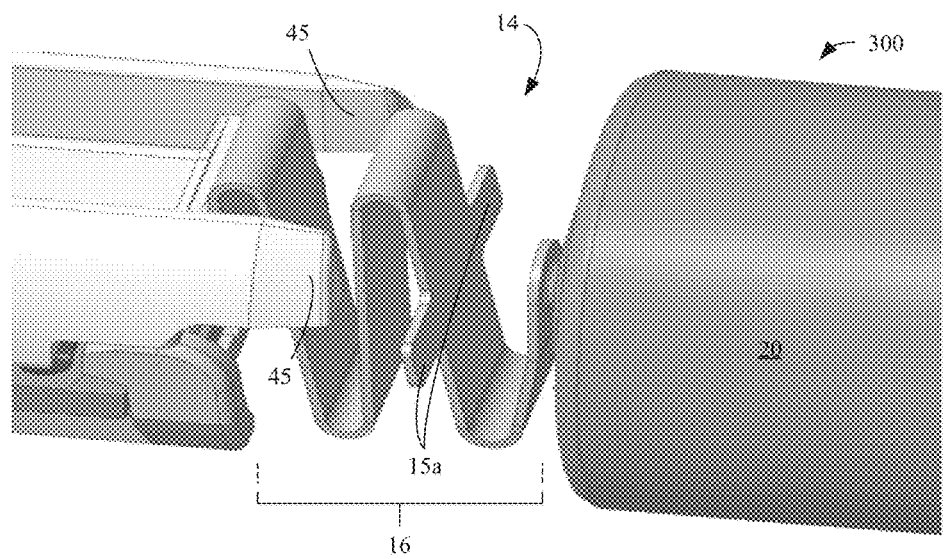
FIG. 2 is a schematic perspective view of an internal battery contact arrangement.

Support element(s) 40 may include other arrangements for preventing damage to spring section 16 and/or PCB 12. Reference is now made to FIG. 2, which is a schematic perspective view of an internal battery contact arrangement 300 of device 100. Support element 40 may include shock load extensions 45. The length of shock load extensions 45 will be equal to at least the length of the spring at the maximal stress limit. In some implementations, the length of shock load extensions 45 is slightly longer than the compressed spring before it starts to permanently deform. In some implementations, the length of shock load extensions 45 is about 2 millimeters.

When battery 20 moves towards PCB 12 and/or compresses spring section 16, at some distance from PCB 12, it collides with shock load extensions 45, which absorbs the kinetic energy. For example, the design of posts 45 may be in accordance to the maximum stress limit of spring section 16. For example, posts 45 are designed such that battery 20 collides with posts 45 before or upon reaching the maximum stress limit of spring section 16, thus avoiding permanent deformation and/or damaging of spring section 16.

For example, at a contraction of more than about 3-3.5 mm, and/or when a force higher than about 600-700 gram (g) is applied on an example spring section 16, it may result in permanent deformation and/or damage to the spring section 16. Therefore, posts 45 may be designed to meet battery 20 at about 2.5-3.5 mm from the contact protrusion 14a when spring section 16 is at rest. For example, in case the entire length of spring section 16 is about 5 mm at rest, posts 45 may protrude about 1.5-2.5 mm beyond the edge of PCB 12. In some implementations, spring section 16 has a spring rate of about 160 g/mm, and/or posts 45 may be designed to meet battery 20 at a contraction of spring section 16 of about 2.6 millimeter.

In some implementations, ear extensions 15a are formed in the closest straight section 15 opposite to contact protrusion 14a, in order to facilitate accurate position of contact protrusion 14a during the manufacturing process, as described in more detail herein.

Figure 3A:
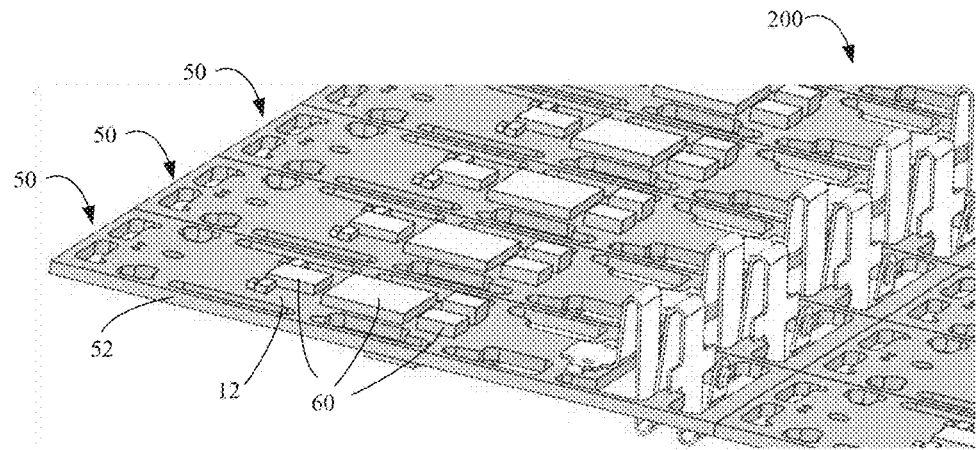
FIGS. 3A, 3B and 3C are schematic perspective views of an elastic contact mounted on a PCB manufacturing panel.
Figure 3B:
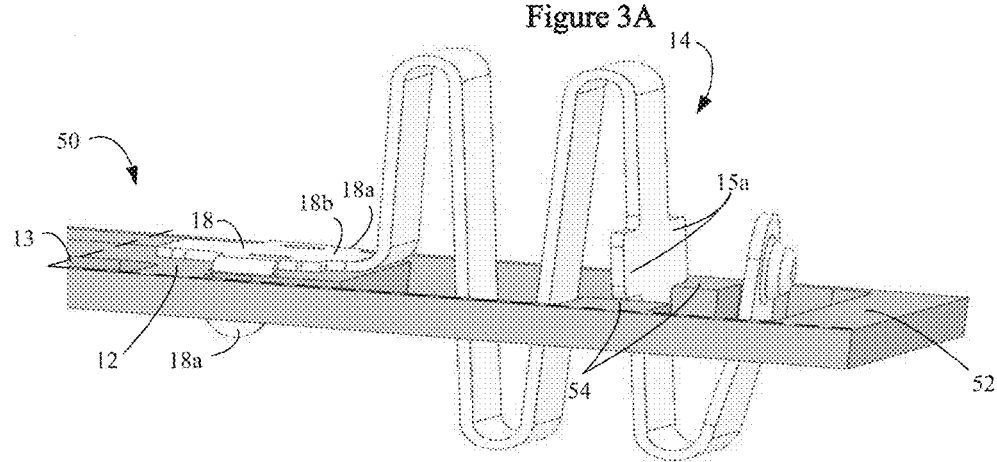
Figure 3C:
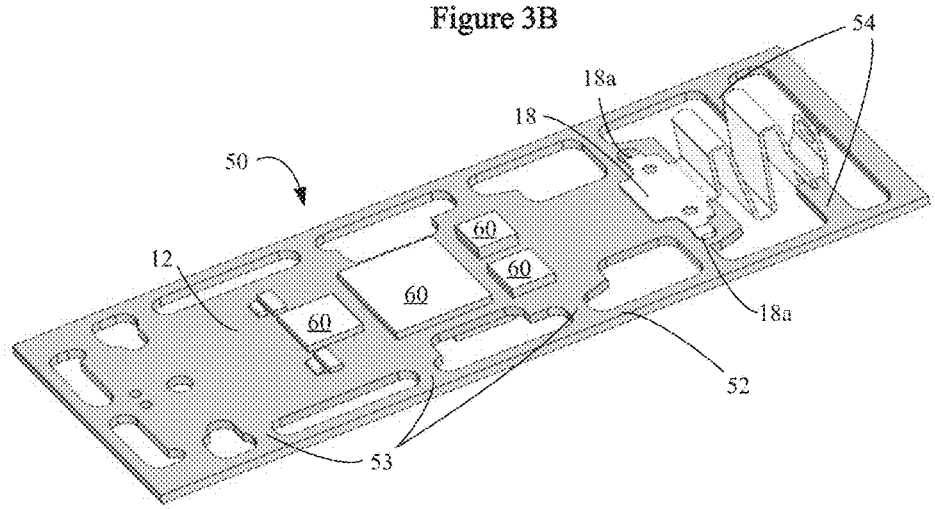

Reference is now made to FIGS. 3A-3C, which are schematic perspective views of elastic contact 14 mounted on a PCB manufacturing panel 50, according to some implementations of the present disclosure.

As shown in FIG. 3A, PCB manufacturing panel 50 may be included in a manufacturing panel array 200, for example a plane array of any suitable number of PCB manufacturing panels 50. Panel array 200 may be suitable for use in a printed circuit manufacturing facility, for automatically manufacturing PCB 12, for example by mounting on PCB 12 electronic components 60.

PCB manufacturing panel 50 may include PCB 12 and a border 52, by which panel 50 may be connected to other panels 50 to form array 200. Border 52 may be connected integrally with PCB 12 by a plurality of bridges 53 between border 52 and PCB 12. Thus, multiple PCB's 12 included in an array 200 may be manufactured concurrently. After manufacturing, a PCB 12 may be trimmed out of panel 50 and installed, for example, in a device 100.

Elastic contact 14 is designed to enable surface-mount installation of elastic contact 14 on PCB 12, as integral part of the PCB's production, for example, without requiring a separate battery contact assembly stage which may delay the production process. Such PCB production may include a pick-and-place process, in which components are delivered to production line machines, which pick the components and mount them on PCBs layered on conveyor belts.

Elastic contact 14 may include, at surface mount 18, tabs 18a for insertion into respective holes in PCB 12 to reinforce the mounting of elastic contact 14 on PCB 12. Tabs 18a may reinforce the mounting of elastic contact 14 on PCB 12 by transforming some of the shear load to bearing load on PCB 12, thus dividing the load on PCB 12 between shear and bearing loads.

Surface mount 18 may include a picking region 18b, designed to facilitate picking of elastic contact 14 by the pick-and-place machines. In some implementations, the diameter of picking region 18b may be about 2.2 millimeter. Picking region 18b may be used for picking by a vacuum cup of the pick-and-place machines. The size of picking region 18b may be sufficient in order to balance the center of mass of elastic contact 14, thus enabling vacuum picking by the pick-and-place machines without a substantial risk of dropping elastic contact 14.

Panel 50 may include supports 54, configured to support corresponding ear extensions 15a in a straight portion 15 of contact 14, for example in order to align contact 14 with the PCB/surface mount plane 13 and/or in an appropriate position. Ear extensions 15a may be formed in the closest straight section 15 opposite to contact protrusion 14a, to enhance the accurate position of contact protrusion 14a. Since elastic contact 14 may be made of a flexible material, supports 54 and ear extensions 15a may be used to ensure that contact protrusion 14a is in a suitable position for contact with a battery 20 when assembled in device 100, for example as shown in FIG. 2.

Figure 4A:
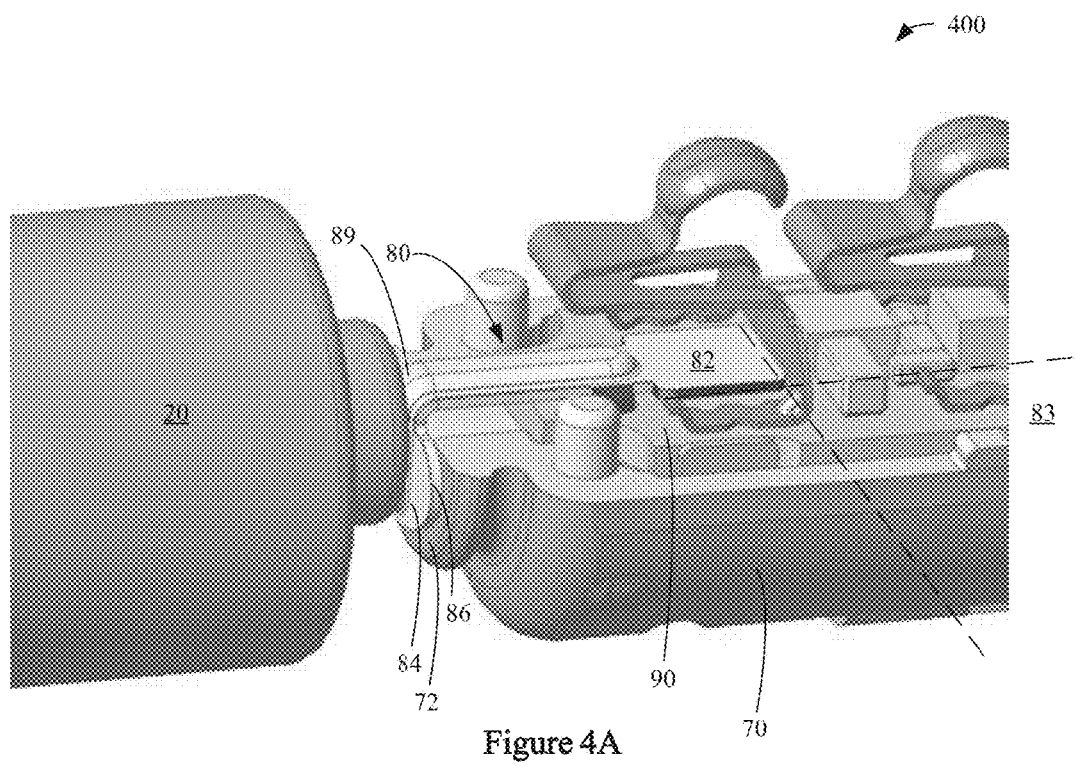
FIGS. 4A and 4B are schematic perspective views of another internal battery contact arrangement at different stages of assembling.
Figure 4B:
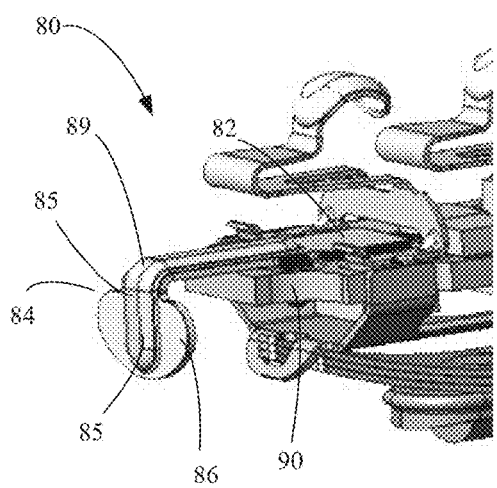

Reference is now made to FIGS. 4A and 4B, which are schematic perspective views of another internal battery contact arrangement 400 of device 100 at different stages of assembling. For example, arrangement 300 may be suitable for a negative battery terminal, and arrangement 400 may be suitable for a positive battery terminal. When device 100 is assembled, arrangement 400 and/or arrangement 300 may be housed in housing 10.

Arrangement 400 may include a PCB 90 and an elastic battery contact element 80. When included in device 100 and/or when in contact with a terminal of battery 20, battery contact element 80 may conduct electric power to PCB 90 from battery 20. The elasticity of battery contact element 80 may enable absorption of bumps that may be caused by movements of battery 20 inside housing 10.

Elastic contact element 80 may be made of and/or include a flexible material such as, for example, a metal strip. In some implementations, elastic contact element 80 is made of a stainless steel. In some implementations, elastic contact 14 is made of a stainless steel, which may include a Full Hard Stainless Steel SS301-FH. The yield stress of the flexible material may, for example, be about 1030 megapascal. PCB 90 with contact element 80 mounted thereon may be assembled upon a support element 70. Support element 70 may have a platform surface 71 and a flat wall 72 substantially perpendicular to surface 71, at an end of support element 70.

Elastic contact element 80 may include a planar surface mount 82 for surface mount assembly upon PCB 90, and a contact head 84 configured for kinetic energy absorption. Surface mount 82 may include a picking region 83, designed to facilitate picking of battery contact 80 by the pick-and-place machines. Contact head 84 is bent, at bend 89, away from a plane 83 of planar mount 82, for example substantially normally to PCB 90 and/or mount 82. When assembled on support 70, contact head 84 leans and/or fits closely against wall 72.

Contact head 84 may be designed to dissipate energy into wall 72 and/or support element 70. Contact head 84 may include a battery contact protrusion 85 at its distal end, and a plate 86. When inserted into housing 10, battery 20 may contact battery contact protrusion 85 in order to provide electrical power to PCB 90.

Battery contact protrusion 85 may have an extension 85a, extending away from the plane 83 of planar mount 82 and/or away from the central longitudinal axis of battery 20, for example towards an edge of the battery terminal. Plate 86 may be located at and/or around extension 85a and/or, for example, in a distorted position relative to the plane 83 of planar mount 82 and/or the longitudinal axis of battery 20. Plate 86 may have a broad shape, such as a fan-shaped plate, that dissipates collision energy away from the plane 83 of planar mount 82, and thus away from the plane of PCB 90 and/or from the longitudinal axis of battery 20. The size of plate 86 may take about 80% of the surface of wall 72, for example in order to provide large contact area with support element 70.

For example, the contact area may be about 3.8 squared millimeters. In some implementations, a thickness of plate 86 may be of about 0.2 millimeters. In some implementations, contact head 84 is designed to contact battery 20 in a distorted location relative to the center of the battery terminal, for example along extension 85a. When pressure is applied on contact head 84 by battery 20, for example when device 100 is shaken or dropped, head 84 may press into wall 72 and dissipate the kinetic energy from battery 20 into wall 72 and/or support 70. Wall 72 may support head 84 and prevent deformation and/or damage which may occur to head 84 by movements of battery 20.

Figure 6:
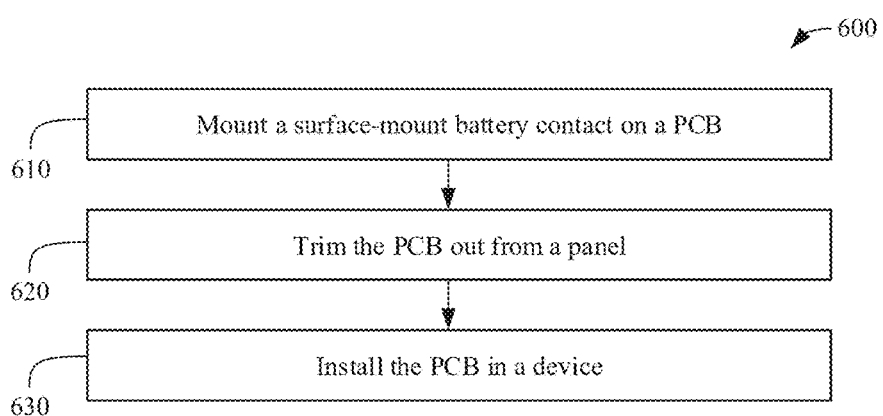
FIG. 6 is a schematic flowchart illustrating a method for manufacturing of a printed circuit board for installing in a battery-powered device.

Reference is now made to FIG. 6, which is a schematic flowchart illustrating a method 600 for manufacturing of a printed circuit board for installing in a battery-powered device, according to some implementations of the present disclosure. As indicated in block 610, a surface mounting machine may mount on a PCB, such as PCB 12 or 90, a PCB surface mount component such as elastic contact element 14 or 80. As described herein, the surface mount component includes a planar mount 18 or 82, configured to be mounted on the PCB and a kinetic energy absorption element such as spring element 16 or contact head 84. As indicated in block 620, the PCB may be trimmed out of panel 50. As indicated in block 630, the PCB with the elastic contact element mounted thereon may be installed in a battery-powered device.

As used herein the term "about" refers to ±10%.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various implementations of this disclosure may be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

According to an aspect of some implementations of the present disclosure there is provided a device including a housing configured to house a battery, a printed circuit board (PCB) within the housing, and a PCB surface mount component, the surface mount component includes a planar mount configured to be mounted on the PCB and a kinetic energy absorption element with a battery contact on a distal end of the energy absorption element, wherein the energy absorption element is bent away from a plane of the planar mount.

In some implementations of the present disclosure, the kinetic energy absorption element includes an elastic spring including a plurality of folds connected by elastic sections.

In some implementations of the present disclosure, the spring section is configured to be compressed until adjacent folds contact each other while the elastic sections keep distance from each other.

In some implementations of the present disclosure, the elastic sections are straight until the adjacent folds of the spring section contact each other.

In some implementations of the present disclosure, the elastic sections bend when adjacent folds are in contact with each other and additional stress is applied on the spring section, thus providing additional energy absorption.

In some implementations of the present disclosure, a spring rate of the elastic spring is between 100-200 g/mm.

In some implementations of the present disclosure, a maximal contraction of the elastic spring is between 2.8-3 mm.

In some implementations of the present disclosure, the device including ear extensions on the elastic spring, the ear extension configured to facilitate accurate position of the battery contact during the manufacturing process.

In some implementations of the present disclosure, the planar mount includes a picking section suitable for picking by a surface mount machine.

In some implementations of the present disclosure, the planar mount includes tabs for insertion into respective holes in the PCB, to reinforce the mounting of the surface mount component on the PCB.

In some implementations of the present disclosure, the device including a support element configured to prevent permanent deformation of the kinetic energy absorption element.

In some implementations of the present disclosure, the device including shock load extensions configured to absorb kinetic energy of the battery when the battery collides with the shock load extensions.

In some implementations of the present disclosure, the shock load extensions extend towards a battery compartment and have a length equal to at least the length of the spring section at maximal contraction.

In some implementations of the present disclosure, the PCB is assembled upon a platform surface of a support element, the support element having a flat wall perpendicular to the platform surface at an end of the support element.

In some implementations of the present disclosure, the absorption element includes a contact head having a battery contact protrusion at one side and a plate at another side of the contact head, the plate fits closely against the flat wall.

In some implementations of the present disclosure, the contact protrusion including an extension that extends away from the plane of the planar mount and is configured to contact a battery in a distorted position relative to the plane of the planar mount.

In some implementations of the present disclosure, the plate is located at the rear side of the extension of the contact protrusion and configured to dissipate collision energy away from the plane of the planar mount.

In some implementations of the present disclosure, the plate is fan-shaped.

According to an aspect of some implementations of the present disclosure there is provided a printed circuit board manufacturing panel, the panel including: a printed circuit board (PCB) configured to receive thereon a PCB surface mount component, the surface mount component includes a planar mount configured to be mounted on the PCB and a kinetic energy absorption element with a battery contact on a distal end of the energy absorption element, and a border around the PCB and connected integrally with the PCB, the border includes supports configured to support corresponding ear extensions in the absorption element in order to align the battery contact with a PCB plane.

According to an aspect of some implementations of the present disclosure there is provided a method for manufacturing of a printed circuit board for installing in a battery-powered device, the method including mounting on a printed circuit board (PCB) a PCB surface mount component including a planar mount configured to be mounted on the PCB and a kinetic energy absorption element with a battery contact on a distal end of the energy absorption element, and trimming the PCB out of a panel including the PCB and a border around the PCB, the border connected integrally with the PCB, wherein the border includes supports configured to support corresponding ear extensions in the absorption element in order to align the battery contact with a PCB plane.

Certain features of the examples described herein, which are, for clarity, described in the context of separate implementations, may also be provided in combination in a single embodiment. Conversely, various features of the examples described herein, which are, for brevity, described in the context of a single embodiment, may also be provided separately or in any suitable sub-combination or as suitable in any other described embodiment of the disclosure. Certain features described in the context of various implementations are not to be considered essential features of those implementations, unless the embodiment is inoperative without those elements.

What is claimed is:

1. A device comprising:
   a housing configured to house a battery;
   a printed circuit board (PCB) within the housing;
   a PCB surface mount component, the surface mount component includes a planar mount configured to be mounted on the PCB and a kinetic energy absorption element with a battery contact on a distal end of the energy absorption element, the kinetic energy element comprises an elastic spring including a plurality of folds connected by elastic sections; and
   ear extensions on the elastic spring, the ear extension configured to facilitate accurate position of the battery contact during a manufacturing process;
   wherein the energy absorption element is bent away from a plane of the planar mount.

2. The device of claim 1, wherein the spring section is configured to be compressed until adjacent folds contact each other while the elastic sections keep distance from each other.

3. The device of claim 2, wherein the elastic sections are straight until the adjacent folds of the spring section contact each other.

4. The device of claim 3, wherein the elastic sections bend when adjacent folds are in contact with each other and additional stress is applied on the spring section, thus providing additional energy absorption.

5. The device of claim 1, wherein a spring rate of the elastic spring is between 100-200 g/mm.

6. The device of claim 1, wherein a maximal contraction of the elastic spring is between 2.8-3 mm.

7. The device of claim 1, wherein the planar mount comprises a picking section suitable for picking by a surface mount machine.

8. The device of claim 1, wherein the planar mount comprises tabs for insertion into respective holes in the PCB, to reinforce the mounting of the surface mount component on the PCB.

9. The device of claim 1, comprising a support element configured to prevent permanent deformation of the kinetic energy absorption element.

10. The device of claim 1, comprising shock load extensions configured to absorb kinetic energy of the battery when the battery collides with the shock load extensions.

11. The device of claim 10, wherein the shock load extensions extend towards a battery compartment and have a length equal to at least the length of the spring section at maximal contraction.

12. The device of claim 1, wherein the PCB is assembled upon a platform surface of a support element, the support element having a flat wall perpendicular to the platform surface at an end of the support element.

13. The device of claim 12, wherein the absorption element comprises a contact head having a battery contact protrusion at one side and a plate at another side of the contact head, the plate fits closely against the flat wall.

14. The device of claim 13, wherein the contact protrusion comprising an extension that extends away from the plane of the planar mount and is configured to contact a battery in a distorted position relative to the plane of the planar mount.

15. The device of claim 14, wherein the plate is located at the rear side of the extension of the contact protrusion and configured to dissipate collision energy away from the plane of the planar mount.

16. The device of claim 15, wherein the plate is fan-shaped.

17. A printed circuit board manufacturing panel, the panel comprising:
   a printed circuit board (PCB) configured to receive thereon a PCB surface mount component, the surface mount component includes a planar mount configured to be mounted on the PCB and a kinetic energy absorption element with a battery contact on a distal end of the energy absorption element; and
   a border around the PCB and connected integrally with the PCB, the border comprises supports configured to support corresponding ear extensions in the absorption element to align the battery contact with a PCB plane.

18. The printed circuit board manufacturing panel of claim 17, wherein the kinetic energy absorption element is bent away from the plane of the planar mount.

19. A method for manufacturing of a printed circuit board for installing in a battery-powered device, the method comprising:
   mounting on a printed circuit board (PCB) a PCB surface mount component comprising a planar mount configured to be mounted on the PCB and a kinetic energy absorption element with a battery contact on a distal end of the energy absorption element; and
   trimming the PCB out of a panel comprising the PCB and a border around the PCB, the border connected integrally with the PCB,
   wherein the border comprises supports configured to support corresponding ear extensions in the absorption element to align the battery contact with a PCB plane.

20. The method of claim 19, further comprising bending the kinetic energy absorption element away from the plane of the planar mount.

* * * * *